(12) United States Patent
Palmateer (10) Patent No.: US 8,040,587 B2
(45) Date of Patent: Oct. 18, 2011

(54) DESICCANT IN A MEMS DEVICE

(75) Inventor: Lauren Palmateer, San Francisco, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 802 days.

(21) Appl. No.: 11/750,279

(22) Filed: May 17, 2007

(65) Prior Publication Data

US 2007/0268581 A1 Nov. 22, 2007

Related U.S. Application Data (60) Provisional application No. 60/801,356, filed on May 17, 2006.

(51) Int. Cl.
*G02B 26/00* (2006.01)
*G02F 1/29* (2006.01)
(52) U.S. Cl. ........ 359/290; 359/224; 359/291; 359/292; 359/295; 359/298; 359/318; 359/512; 359/513
(58) Field of Classification Search .................. 359/223, 359/224, 290–292, 295, 298, 318
See application file for complete search history.

(56) References Cited

U.S. PATENT DOCUMENTS

| | | | |
|---|---|---|---|
| 4,036,360 A | 7/1977 | Deffeyes | |
| 4,074,480 A | 2/1978 | Burton | |
| 4,531,126 A | 7/1985 | Sadones | |
| 4,844,614 A | 7/1989 | Henderson et al. | |
| 4,983,824 A | 1/1991 | Saaski et al. | |
| 5,244,707 A | 9/1993 | Shores | |
| 5,304,419 A | 4/1994 | Shores | |
| 5,591,379 A | 1/1997 | Shores | |
| 5,610,438 A | 3/1997 | Wallace et al. | |
| 5,614,785 A | 3/1997 | Wallace et al. | |
| 5,882,761 A | 3/1999 | Kawami et al. | |
| 5,939,785 A | 8/1999 | Klonis et al. | |
| 6,031,657 A | 2/2000 | Robinson et al. | |
| 6,040,937 A | 3/2000 | Miles | |
| 6,261,853 B1 | 7/2001 | Howell et al. | |
| 6,445,062 B1 | 9/2002 | Honda | |
| 6,589,625 B1 | 7/2003 | Kothari et al. | |
| 6,650,455 B2 | 11/2003 | Miles | |

(Continued)

FOREIGN PATENT DOCUMENTS

DE 102 24 780 12/2003

(Continued)

OTHER PUBLICATIONS

IPRP for PCT/US07/011838 filed May 17, 2007.

(Continued)

*Primary Examiner* — Evelyn A. Lester
(74) *Attorney, Agent, or Firm* — Knobbe Martens Olson & Bear LLP (57) ABSTRACT

A package structure and method for packaging a MEMS device is described. In one embodiment, the MEMS base device can include a substrate having a MEMS device formed thereon, a backplate, an exposed or activated desiccant disposed between the backplate and the transparent substrate, and a cover at least partially encapsulating said desiccant. In another embodiment, a MEMS display device can be manufactured by contacting the substrate and/or backplate with a cover which at least partially encapsulates a desiccant, joining the backplate and the substrate to form a package, and exposing or activating the desiccant.

24 Claims, 8 Drawing Sheets

U.S. PATENT DOCUMENTS

| | | | |
|---|---|---|---|
| 6,674,562 B1 | 1/2004 | Miles | |
| 6,680,792 B2 | 1/2004 | Miles | |
| 6,791,660 B1 | 9/2004 | Hayashi et al. | |
| 7,042,643 B2 | 5/2006 | Miles | |
| 7,123,216 B1 | 10/2006 | Miles | |
| 7,164,520 B2 | 1/2007 | Palmateer et al. | |
| 7,315,115 B1 | 1/2008 | Curtin et al. | |
| 7,368,803 B2 | 5/2008 | Gally et al. | |
| 7,405,924 B2 | 7/2008 | Gally et al. | |
| 7,551,246 B2 * | 6/2009 | Palmateer | 349/106 |
| 7,573,547 B2 | 8/2009 | Palmateer et al. | |
| 7,746,537 B2 | 6/2010 | Natarajan | |
| 2002/0056900 A1 | 5/2002 | Liu et al. | |
| 2002/0063322 A1 | 5/2002 | Robbins et al. | |
| 2002/0119724 A1 | 8/2002 | Hammel | |
| 2002/0126364 A1 | 9/2002 | Miles | |
| 2002/0149096 A1 | 10/2002 | Liebeskind | |
| 2003/0062186 A1 | 4/2003 | Boroson et al. | |
| 2003/0108306 A1 | 6/2003 | Whitney et al. | |
| 2003/0121418 A1 | 7/2003 | Loop et al. | |
| 2003/0122137 A1 | 7/2003 | Hashimoto | |
| 2003/0138656 A1 | 7/2003 | Sparks | |
| 2003/0160021 A1 | 8/2003 | Platt et al. | |
| 2003/0167798 A1 | 9/2003 | Borrelli et al. | |
| 2003/0184412 A1 | 10/2003 | Gorrell | |
| 2004/0051929 A1 | 3/2004 | Sampsell et al. | |
| 2004/0061492 A1 | 4/2004 | Lopes et al. | |
| 2004/0100677 A1 | 5/2004 | Huibers et al. | |
| 2004/0115856 A1 | 6/2004 | Jung et al. | |
| 2004/0122175 A1 | 6/2004 | Hekal | |
| 2004/0166603 A1 | 8/2004 | Carley | |
| 2004/0189195 A1 | 9/2004 | Allemand | |
| 2004/0191568 A1 | 9/2004 | Ohshita et al. | |
| 2004/0213962 A1 | 10/2004 | Bourdelais et al. | |
| 2004/0259370 A1 | 12/2004 | Bergman | |
| 2005/0074919 A1 | 4/2005 | Patel et al. | |
| 2005/0093134 A1 | 5/2005 | Tarn | |
| 2005/0247477 A1 | 11/2005 | Kothari et al. | |
| 2005/0253283 A1 | 11/2005 | DCamp et al. | |
| 2006/0066600 A1 | 3/2006 | Palmateer | |
| 2006/0066932 A1 | 3/2006 | Chui et al. | |
| 2006/0066935 A1 | 3/2006 | Cummings et al. | |
| 2006/0076632 A1 | 4/2006 | Palmateer et al. | |
| 2006/0076637 A1 | 4/2006 | Gally | |
| 2006/0077126 A1 | 4/2006 | Kothari | |
| 2006/0077145 A1 | 4/2006 | Floyd | |
| 2006/0077146 A1 | 4/2006 | Palmateer | |
| 2006/0077503 A1 | 4/2006 | Palmateer et al. | |
| 2006/0163711 A1 * | 7/2006 | Roels | 257/680 |
| 2007/0041076 A1 | 2/2007 | Zhong et al. | |
| 2007/0170568 A1 | 7/2007 | Palmateer et al. | |
| 2008/0112036 A1 | 5/2008 | Cummings | |
| 2008/0164544 A1 | 7/2008 | Palmateer et al. | |
| 2008/0272446 A1 * | 11/2008 | Haluzak et al. | 257/415 |
| 2010/0172013 A1 | 7/2010 | Palmateer | |
| 2011/0053304 A1 | 3/2011 | Palmateer et al. | |

FOREIGN PATENT DOCUMENTS

| | | |
|---|---|---|
| EP | 0 969 700 | 1/2000 |
| EP | 1 220 010 | 7/2002 |
| EP | 1 251 546 | 10/2002 |
| EP | 1418154 A2 | 5/2004 |
| EP | 1 640 322 | 3/2006 |
| EP | 1 640 323 | 3/2006 |
| EP | 1 640 324 | 3/2006 |
| EP | 1 640 329 | 3/2006 |
| JP | 2003-217828 | 7/2003 |
| WO | WO 02/39513 | 5/2002 |
| WO | WO 02/42716 A2 | 5/2002 |
| WO | WO 02/093240 | 11/2002 |
| WO | WO 03/009317 | 1/2003 |
| WO | WO 2005/110914 A1 | 11/2005 |
| WO | WO 2005/114294 A1 | 12/2005 |

OTHER PUBLICATIONS

Moraja, et al., Advanced Getter Solutions at Wafer Level to Assure High Reliability to the last Generations MEMS, IEEE Reliability Physics Symposium Proceedings, 2003, pp. 458-459.

ISR and WO for PCT/US07/011838 filed May 17, 2007.

Keusseyan et al., A new approach for opto-electronic/MEMS packaging, Proceedings 52nd Electronic Components and Technology Conference, ECTC May 2002, pp. 259-262.

Previti et al., Getters: micromolecular scavengers for packaging, Proceedings international Symposium on Advanced Packaging Materials Processes, Properties and Interfaces, 2001, pp. 201-206.

* cited by examiner

| | Column Output Signals | |
|---|---|---|
| | $+V_{bias}$ | $-V_{bias}$ |
| Row Output Signals   0 | Stable | Stable |
| $+\Delta V$ | Relax | Actuate |
| $-\Delta V$ | Actuate | Relax |

DESICCANT IN A MEMS DEVICE

CROSS-REFERENCE TO RELATED APPLICATIONS

This application claims priority to U.S. Provisional Application No. 60/801,356, filed May 17, 2006, which is hereby incorporated by reference, in its entirety.

BACKGROUND

1. Field of the Invention

The field of the invention relates to microelectromechanical systems and the packaging of such systems. More specifically, the field of the invention relates to interferometric modulators and methods of fabricating such modulators using a desiccant.

2. Description of the Related Technology

Microelectromechanical systems (MEMS) include micromechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

The system, method, and devices described herein each have several aspects, no single one of which is solely responsible for its desirable attributes. After considering this discussion, and particularly after reading the section entitled "Detailed Description of Certain Embodiments" one will understand how the features of described herein provide advantages over other display devices. Some embodiments described herein provide a package structure and a method of manufacturing a package structure in ambient conditions.

An embodiment provides a MEMS based device comprising a substrate having a MEMS device formed thereon, a backplate, a desiccant disposed between the backplate and the substrate, and a cover at least partially encapsulating the desiccant, wherein the desiccant is exposed or activated. Some embodiments may further comprise a seal surrounding said MEMS device between the substrate and the backplate.

Another embodiment provides a method of manufacturing a display device, comprising providing a substrate having a MEMS device formed thereon, providing a backplate, contacting the substrate and/or backplate with a cover, and joining the backplate to the substrate to form a package, wherein the MEMS device is encapsulated by the package, and exposing or activating the desiccant. Optionally, a seal can also be applied between the backplate and the substrate. Some embodiments may provide the cover that is configured to form a border around the MEMS device. Another embodiment provides a MEMS based device made by this method.

A MEMS based device comprising means for transmitting light, means for interferometrically reflecting light through said transmitting means formed on said transmitting means, means for encapsulating said interferometrically reflecting means, means for desiccating an environment surrounding said interferometrically reflecting means, said desiccating means is exposed or activated, and means for protecting said desiccating means, said protecting means is positioned between the encapsulating means and the transmitting means.

These and other embodiments are described in greater detail below.

BRIEF DESCRIPTION OF THE DRAWINGS

These and other aspects will be readily apparent from the following description and from the appended drawings (not to scale), which are meant to illustrate and not to limit the embodiments described herein, and wherein.

DETAILED DESCRIPTION OF CERTAIN EMBODIMENTS

The following detailed description is directed to certain specific embodiments. However, the devices and methods described herein can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

One embodiment is a MEMS device that includes an integrated desiccant, where the desiccant has an exterior protective surface. In one embodiment, the MEMS device is manufactured with a desiccant that is activated when a backplate and a substrate are brought together. In one embodiment, the desiccant is sealed within a breakable tube or cover. The tube or cover is placed between the backplate and the substrate of the MEMS device. When the backplate and the substrate are brought together, the tube or cover is compressed. This compression leads to breakage of the tube which thereby exposes the desiccant in the tube to the interior cavity of the MEMS based device. In one embodiment, the MEMS device is an interferometric modulator.

In another embodiment, a desiccant is loaded into a cover that serves an exterior protective surface or cover that is a "U" shaped metal frame. The frame is positioned around the circumference of a MEMS device, such as an interferometric modulator. The frame is positioned so that the desiccant material is exposed to the interior of the MEMS device by placing the open side of the "U" shaped metal frame towards the center of the device. When a backplate is sealed to the substrate of the MEMS device, the metal frame acts as a moisture barrier to prevent outside moisture from entering the interior of the device, and also contains a desiccant that absorbs any moisture that does enter the device.

Figure 1:
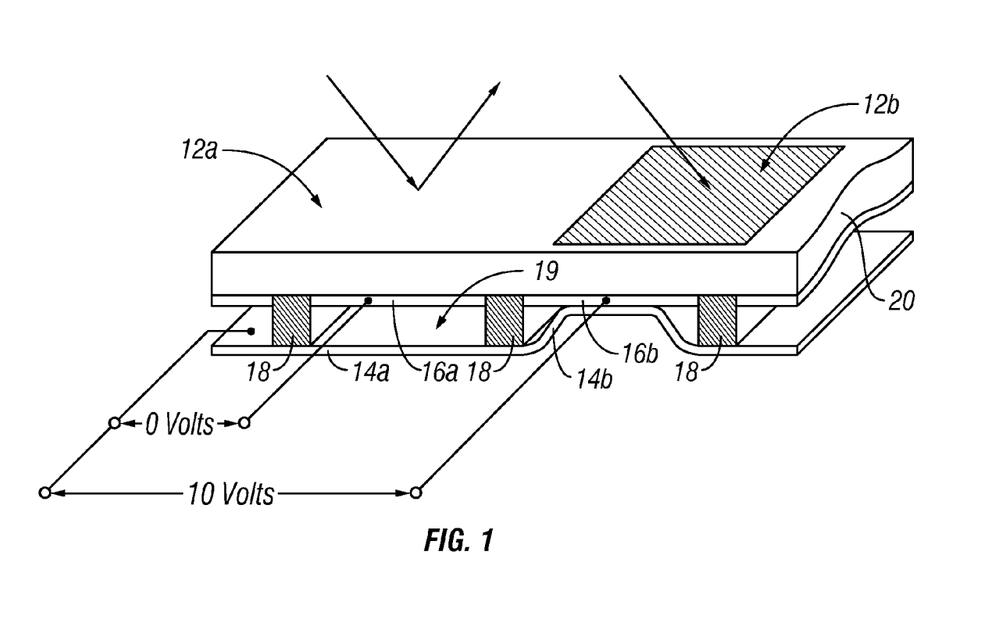
FIG. 1 is an isometric view depicting a portion of one embodiment of an interferometric modulator display in which a movable reflective layer of a first interferometric modulator is in a released position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and highly reflective layer 14a is illustrated in a relaxed position at a predetermined distance from a fixed partially reflective layer 16a. In the interferometric modulator 12b on the right, the movable highly reflective layer 14b is illustrated in an actuated position adjacent to the fixed partially reflective layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers 14a, 14b are separated from the fixed metal layers by a defined gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
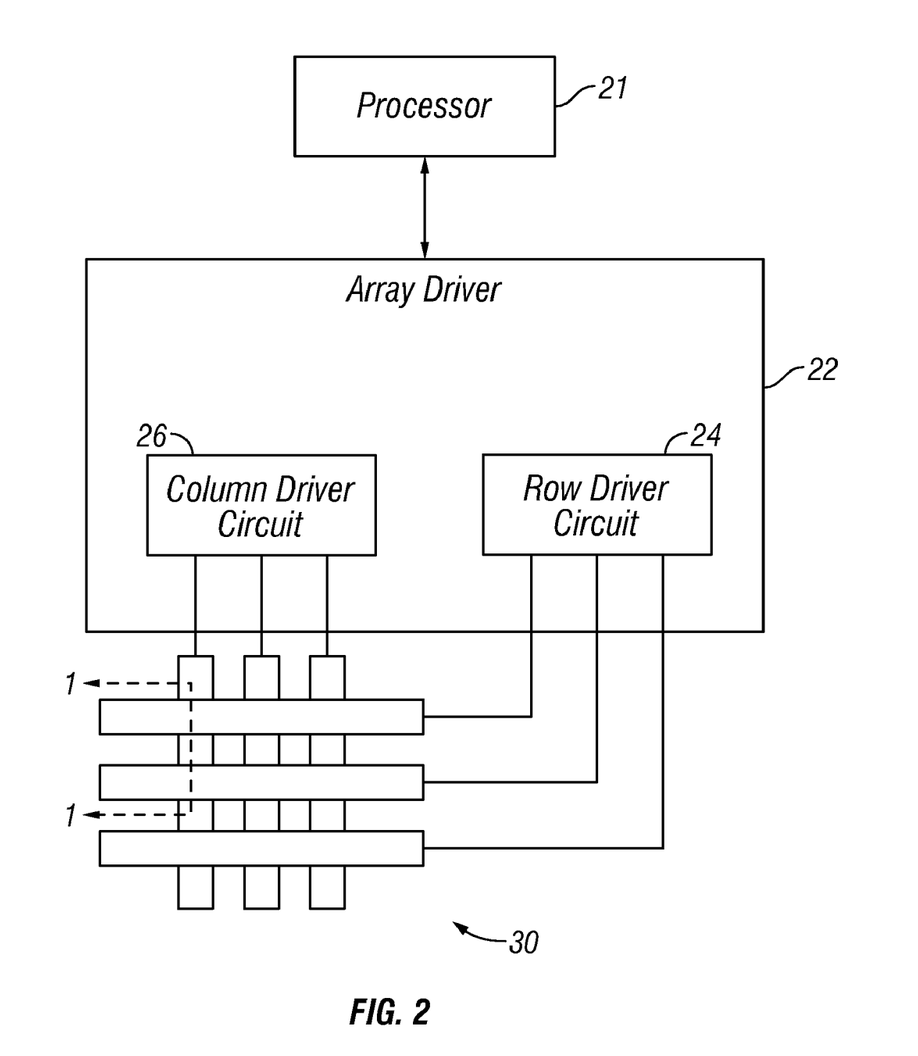
FIG. 2 is a system block diagram illustrating one embodiment of an electronic device incorporating a 3×3 interferometric modulator display.
Figure 3:
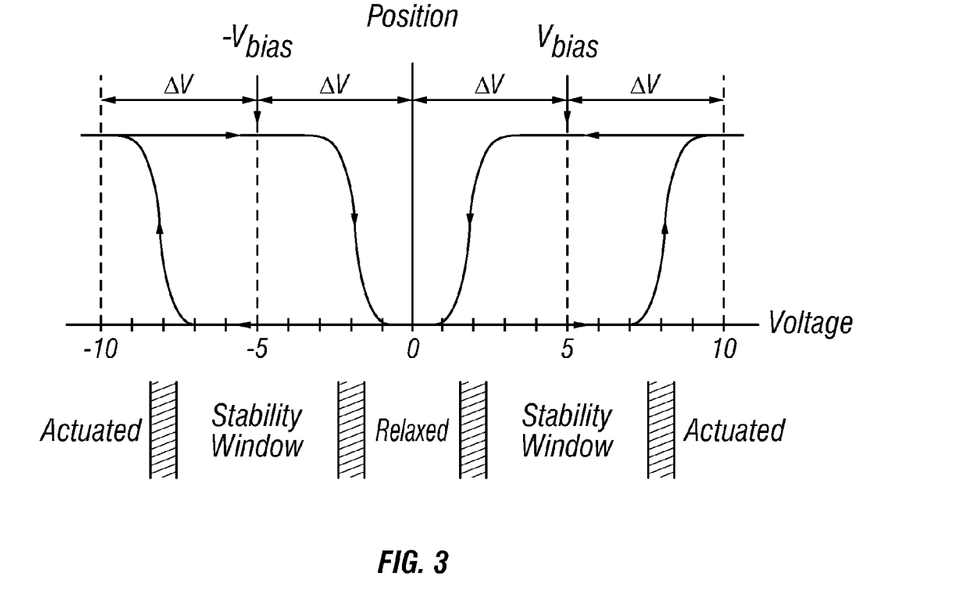
FIG. 3 is a diagram of movable mirror position versus applied voltage for one exemplary embodiment of an interferometric modulator of FIG. 1.

FIG. 2 is a system block diagram illustrating one embodiment of an electronic device. In the exemplary embodiment, the electronic device includes a processor 21 which may be any general purpose single- or multi-chip microprocessor such as an ARM, Pentium®, Pentium II®, Pentium III, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the systems described herein.

Figure 4:
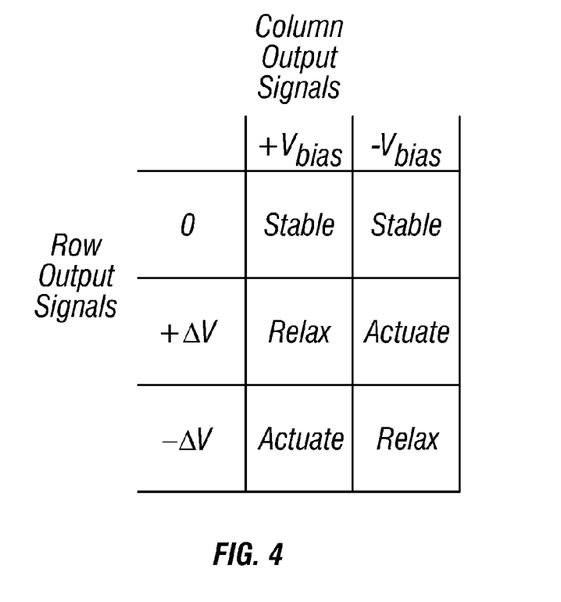
FIG. 4 is an illustration of a set of row and column voltages that may be used to drive an interferometric modulator display.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to −Vbias, and the appropriate row to +ΔV, which may correspond to −5 volts and +5 volts respectively Relaxing the pixel is accomplished by setting the appropriate column to +Vbias, and the appropriate row to the same +ΔV, producing a zero volt potential difference across the pixel. In those rows where the row voltage is held at zero volts, the pixels are stable in whatever state they were originally in, regardless of whether the column is at +Vbias, or −Vbias. As is also illustrated in FIG. 4, it will be appreciated that voltages of opposite polarity than those described above can be used, e.g., actuating a pixel can involve setting the appropriate column to +Vbias, and the appropriate row to −ΔV. In this embodiment, releasing the pixel is accomplished by setting the appropriate column to −Vbias, and the appropriate row to the same −ΔV, producing a zero volt potential difference across the pixel.

Figure 5A:
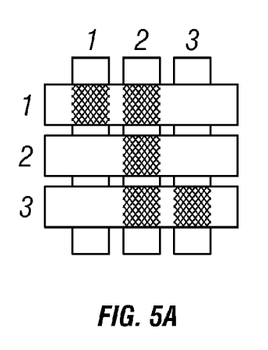
FIG. 5A illustrates one exemplary frame of display data in the 3×3 interferometric modulator display of FIG. 2.
Figure 5B:
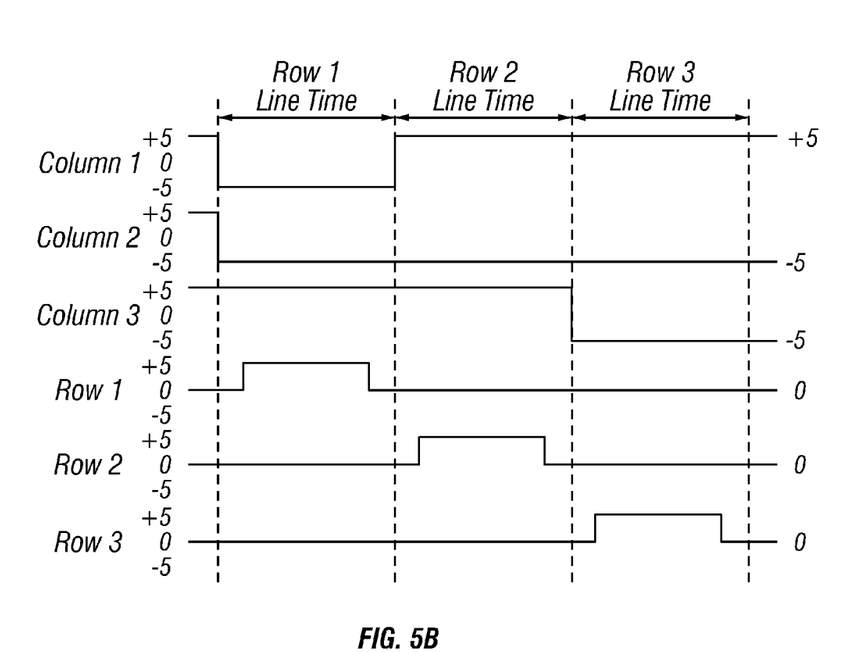
FIG. 5B illustrates one exemplary timing diagram for row and column signals that may be used to write the frame of FIG. 5A.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
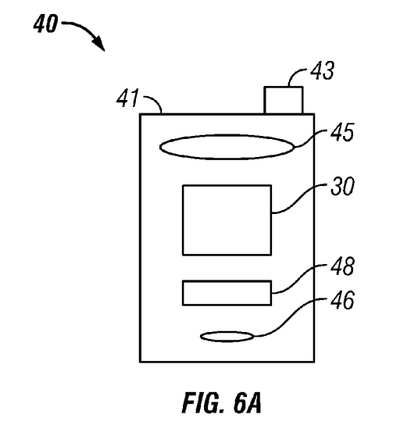
FIGS. 6A and 6B are system block diagrams illustrating an embodiment of a display device.
Figure 6B:
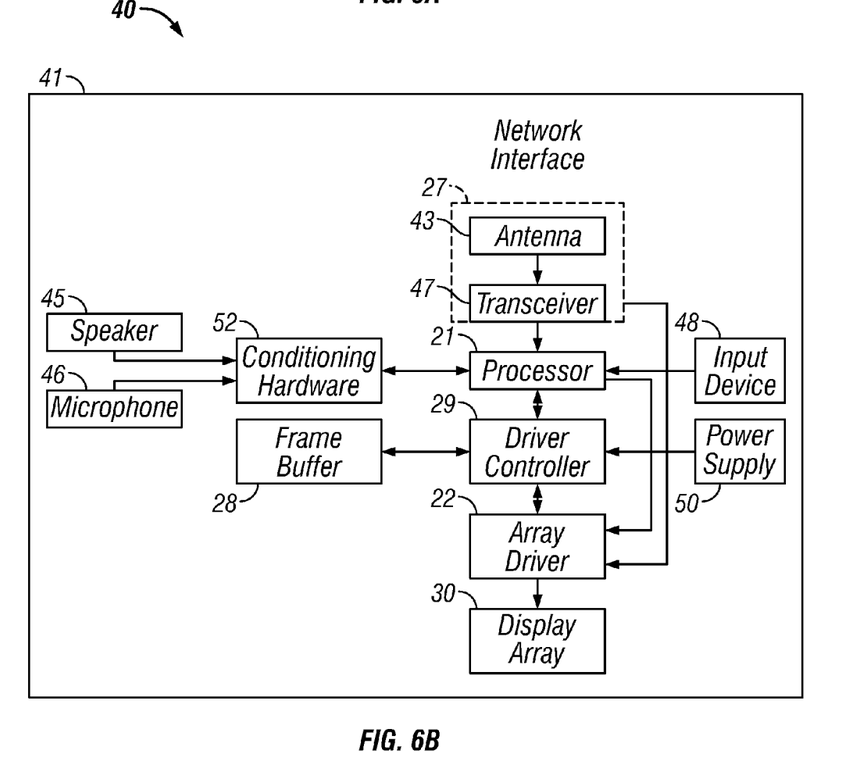

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 44 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 44, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
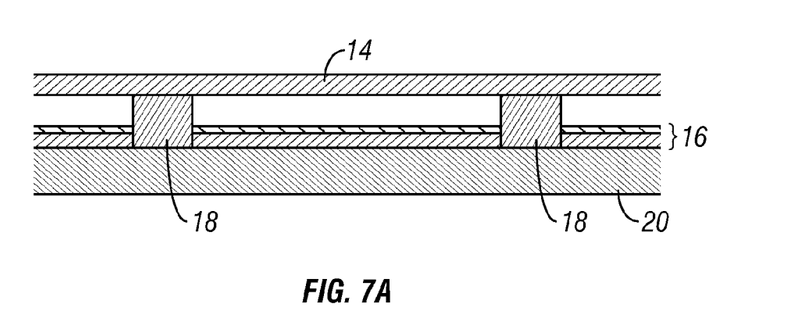
FIG. 7A is a cross section of the device of FIG. 1.
Figure 7B:
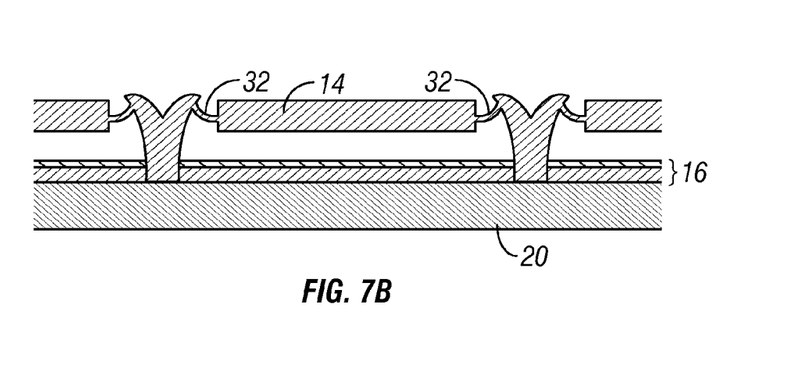
FIG. 7B is a cross section of an alternative embodiment of an interferometric modulator.
Figure 7C:
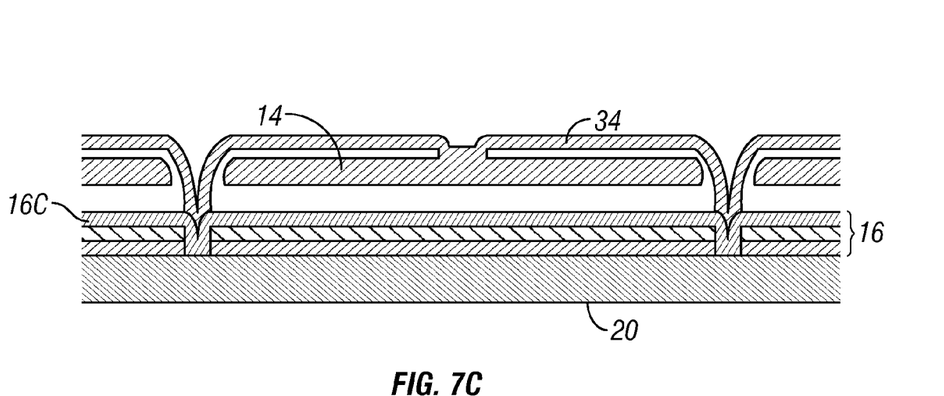
FIG. 7C is a cross section of another alternative embodiment of an interferometric modulator.
Figure 7D:
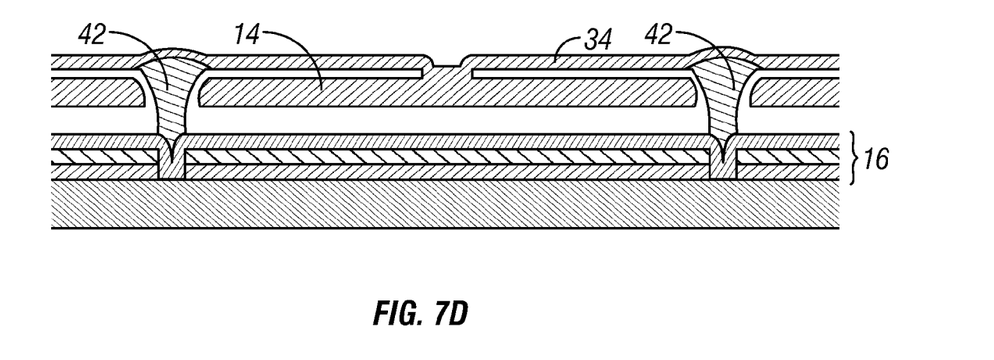
FIG. 7D is a cross section of yet another alternative embodiment of an interferometric modulator.
Figure 7E:
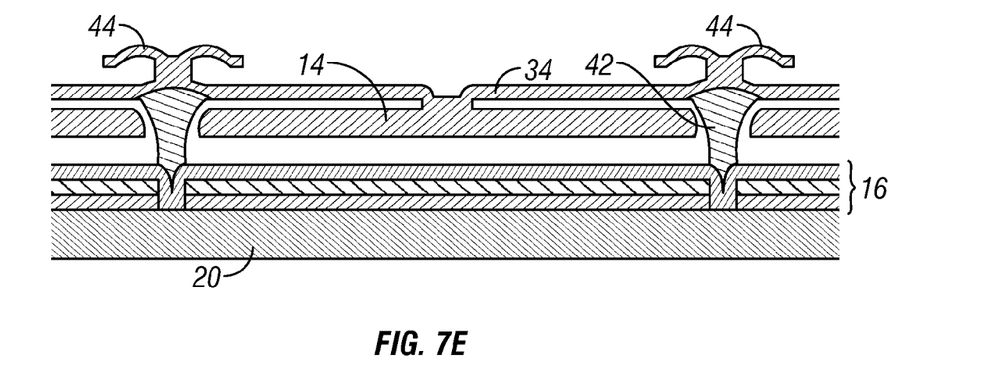
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support or support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the MEMS devices (e.g., interferometric modulators) function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties. The production of various types of interferometric devices is described in a variety of published documents, including, for example, U.S. Published Application 2004/0051929. A wide variety of well known techniques may be used to produce the above described structures involving a series of material deposition, patterning, and etching steps.

Figure 8:
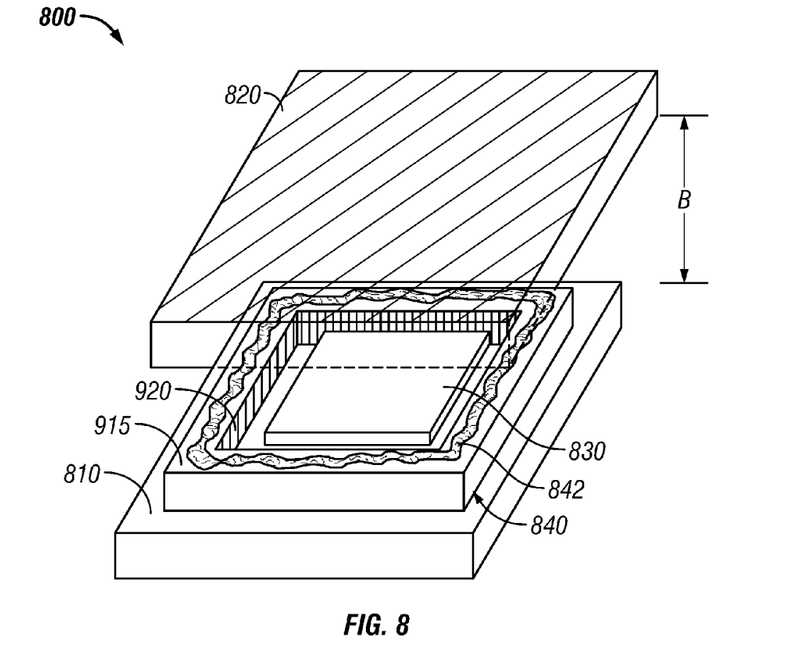
FIG. 8 is a perspective view of one embodiment of an interferometric modulator having a desiccant (indicated by the vertically-hatched area) encapsulated by a cover.

Packaging techniques for interferometric modulators will be described in more detail below. Interferometric modulators typically include moving parts, such as the movable mirrors 14a, 14b that must have a protected space in which to move. A schematic of one embodiment 800 of an interferometric modulator is illustrated in FIG. 8. As shown in FIG. 8, a basic package structure 800 includes a substrate 810 and a backplate cover or "cap" 820. An interferometric modulator array 830 is encapsulated within the package structure 800. Preferably, the backplate 820 and substrate 810 are sealed together to protect the interferometric modulator array 830 from harmful elements in the environment, such as moisture. A covered desiccant 840 is also shown in circumscribing the interferometric modulator array 830, wherein the covered desiccant 840 comprises a desiccant 920 and a cover 915. The covered desiccant also has a seal 842 on the upper surface of the cover 915 to seal the backplate 820 to the substrate 810.

A method of packaging an interferometric modulator according to the embodiment shown in FIG. 8 will be discussed in more detail below. The packages and packaging methods described herein may be used for packaging any MEMS device, including, but not limited to, the interferometric modulators described above.

As discussed above, the interferometric modulator 830 is configured to reflect light through the substrate and includes moving parts, such as the movable mirrors 14a, 14b. Therefore, to allow such moving parts to move, a gap or cavity is preferably created between such moving parts and the backplate 820. The gap or cavity allows the mechanical parts, such as the movable mirrors 14a, 14b, of the interferometric modulator 830 to move. It will be understood that, in an embodiment, the gap or cavity is created when a backplate 820 is joined to the substrate 810, as shown in FIG. 8.

The substrate 810 may be any transparent or opaque substance capable of having thin film or MEMS devices built upon it. Such substances include, but are not limited to, glass, plastic, and polymers. Images may be displayed through the substrate 810, which serves as an imaging surface. The substrate 810 is therefore a means for transmitting light.

In accordance with an embodiment, the interferometric modulator 830 is preferably formed on a substrate 810. It will be understood that the fixed mirrors 16a, 16b of the interferometric modulator 830 are adjacent the substrate 810 and the movable mirrors 14a, 14b are formed over the fixed mirrors 16a, 16b such that the movable mirrors 14a, 14b may move within the cavity of the package structure 800 of the embodiment shown in FIG. 8. The interferometric modulator 830 is also a means for interferometrically reflecting light.

To form the interferometric modulator 830, the substrate 810, in one embodiment, is covered with indium tin oxide (ITO). The ITO may be deposited by standard deposition techniques, including chemical vapor deposition (CVD) and sputtering, preferably to a thickness of about 500 Å. A relatively thin layer of chrome is preferably deposited over the ITO. The ITO/chrome bilayer is then etched and patterned into columns to form the column electrodes 16a, 16b. A layer of silicon dioxide ($SiO_2$) is preferably formed over the ITO/chrome columns to create partially reflective fixed mirrors 16a, 16b. A sacrificial layer of silicon (Si) is preferably deposited (and later released) over the structure to create a resonant optical cavity between the fixed mirrors 16a, 16b and the movable mirrors 14a, 14b. In other embodiments, this sacrificial layer may be formed of molybdenum (Mo), tungsten (W), or titanium (Ti).

Another mirror layer, preferably formed of aluminum, is deposited over the sacrificial layer of silicon to form the movable mirrors 14a, 14b of the interferometric modulator 830. This mirror layer is deposited and patterned into rows orthogonal to the column electrodes 16a, 16b to create the row/column array described above. In other embodiments, this mirror layer may comprise highly reflective metals, such as, for example, silver (Ag) or gold (Au). Alternatively, this mirror layer may be a stack of metals configured to give the proper optical and mechanical properties.

The sacrificial layer of silicon is removed, preferably using a gas etching process, after the movable mirrors 14a, 14b are formed to create the optical cavity between the fixed mirrors 16a, 16b and the movable mirrors 14a, 14b. In an embodiment, this sacrificial layer is removed after the backplate 820 is joined to the substrate 810 through an opening in either the backplate 820 or perimeter seal, as will be described in more detail below. Standard etching techniques may be used to remove the sacrificial layer of silicon. The particular release etching will depend on the material to be released. For example, xenon diflouride ($XeF_2$) may be used to remove the silicon sacrificial layer. In another embodiment, the sacrificial layer of silicon between the mirrors 16a, 16b, 14a, 14b is removed before the backplate 820 is joined to the substrate 810. The skilled artisan will appreciate that each layer of the interferometric modulator 830 is preferably deposited and patterned using standard deposition techniques and standard photolithographic techniques.

The skilled artisan will understand that the backplate 820 serves a mechanical function, protecting the interferometric modulator 830 from contaminants in the environment. The backplate 820 along with the substrate 810 and a cover 915 for the desiccant 920 (which is described in more detail below) prevent mechanical interference, moisture, and contaminant gases from reaching and potentially damaging the interferometric modulator 830 within the package 800. The backplate 820 may therefore be formed of any suitable material, whether transparent or opaque, conductive or insulating. Suitable materials for the backplate 820 include, but are not limited to, glass (e.g. float, 1737, soda lime), plastic, ceramics, polymers, laminates, and metals and metal foils (e.g. stainless steel (SS302, SS410), Kovar, plated Kovar). The backplate 820 provides a means for encapsulating.

A sealing means or a seal 842 is typically provided to join the substrate 810 and the backplate 820 to form the package structure 800. The seal is typically a semi-hermetic seal, such as a conventional epoxy-based adhesive. In other embodiments, the seal may be Polyisobutylene (PIB), o-rings, polyurethane, thin film metal weld, liquid spin-on glass, solders, glass frit or silica glass mixtures (fired to make a solid glass frit), polymers, or plastics, among other types of seals. In still other embodiment, the seal may be a hermetic seal.

Although in the embodiment shown in FIG. 8, the seal 842 is shown as deposited on the upper surface of the cover 915, it should be understood that the seal 842 could also be deposited on the lower surface or on both the upper and the lower surfaces of the cover 915. In other embodiments, seal 842 could also be a separate layer within the device 800. For example, a layer of sealant can be deposited around the outer periphery of the cover 915. Alternatively, the layer of sealant can be deposited around an inner periphery of the cover 915. In some embodiments, the layer of sealant can be deposited around select portions of the cover 915 to aid the sealing of the substrate 810 and the backplate 820. In other embodiments, the sealant material could be incorporated into the structure of covered desiccant 840 by mixing the sealant material with the desiccant or by depositing a separate layer of sealant onto the desiccant 920. Useful sealant materials include those that can be activated by heat, ultraviolet light or are room temperature pressure sensitive adhesives (PSA). The desiccant, the cover and the sealant can alternatively be positioned on the backplate 820. In some embodiments, the seal 842 may be deposited closer to either the inner or the outer edge of the cover 915. In these configurations, the sealant material could flow down the side of the cover 915 as it melts or is being compressed during the assembly process to join the substrate 810 and the backplate 820 in a continuous seal. This can also serve to bind the desiccant material in place when the sealant material is not incorporated into the desiccant 920.

Once the backplate 820 and substrate 810 are joined, the seal 842 may be cured and hardened. The skilled artisan will appreciate that the seal 842, which may be hardened, between the backplate 820 and the substrate 810 is different from seals that may be applied after division of the package structure 800 into individual arrays.

It is generally desirable to manufacture several arrays of interferometric modulators on a single substrate, apply the backplate 820, and then divide the structure into individual arrays. Once the seal 842 is hardened, the structure may be mechanically or laser scribed or otherwise prepared for division. Depending on the seal, as well as other factors, it may be necessary, after the division, to apply an endseal to the individual package structures or arrays.

In one embodiment having a hermetic seal, the seal 842 is a hermetic barrier that acts as an environmental barrier preventing all air and water vapor from flowing through the seal 842 and entering the package structure 800. Suitable materials for a hermetic seal include, but are not limited to, welds, solders, adhesives mixed with molecular sieves, such as a Zeolite. The adhesive component alone may not act as a suitable environmental barrier because it will eventually allow moisture and other contaminants to permeate into the package structure 800. Thus, in one embodiment, the package structure 800 also includes a desiccant 920 which reduces moisture from the interior environment of the package structure 800. A semi-hermetic seal 842 of one of the aforementioned materials is desirable for space-critical environments because the seal 842 can be very thin and inexpensive, relative to other sealing techniques, such as welding and soldering. The semi-hermetic seal 842 may be applied through simple in-line manufacturing processes, whereas the techniques of welding and soldering for hermetic seals require very high temperature processes that can damage the package structure 800, are relatively expensive, and tend to occupy much more space because a welded or soldered seal is thicker. It will be understood that a semi-hermetic seal may include an adhesive that is not mixed with any molecular sieves or desiccants.

In one embodiment, the zeolites may include aluminosilicate-structured minerals, such as sodium aluminosilicate. In another embodiment, the zeolites may include microporous silicate-structured minerals. It will be appreciated that active components, other than zeolites, that can act as absorbing filters on the molecular level can also be used. In one embodiment, the adhesives may be a low outgassing adhesive. In other embodiments, the adhesives may be adhesives with varied outgassing. A desiccant used herein may be a calcium dioxide, strontium oxide (SRO), silica gels, montmorillonite clay (preferably a magnesium aluminum silicate), molecular sieves (zeolites such as $Na_{12}AlO_3SiO_{212}XH_2O$), or calcium sulfates.

The skilled artisan will understand that the amount of material for the seal 842 will depend on the estimated amount of moisture or contaminant gases that will need to be removed from within the package structure 800 during the lifetime of the device 800. The amount of material for the seal 842 also depends not only on the amount of moisture or contaminant gases inside the package structure 800 when the package is formed, but also the permeation rate of the seal 842 and the outgassing potential of the package components.

Zeolites may absorb water molecules at relatively high temperatures. Zeolites can trap moisture and contaminant gases in their pores. The skilled artisan will understand that zeolites having deferent pore sizes can be selected for the seal 842 material to absorb different contaminants. In an embodiment, zeolites are selected to absorb contaminant molecules, such as aromatic branched-chain hydrocarbons that have critical diameters of up to ten angstroms. In another embodiment, zeolites having pore sizes between two and three angstroms may be selected to abort contaminant molecules having diameters of less than two angstroms, such as hydrogen and moisture molecules. In still another embodiment, zeolites having pore sizes of about fifty angstroms (50 Å) can be used to absorb nitrogen and carbon dioxide molecules. The skilled artisan will appreciate that the hermetic seal may be comprised of a mixture of zeolites having various pore sizes.

The seal 842 is typically applied to the substrate 810 along the perimeter, around the interferometric modulator 830. The skilled artisan will understand that, in an embodiment in which the package structure 800 contains more than one interferometric modulator 830, the seal 842 is typically applied to the substrate 810 around the perimeter of the plurality of interferometric modulators 830. In certain embodiments, the seal 842 is formed to a thickness in a range of about 1-20 microns, about 1-15 microns, about 1-10 microns about 1-5 microns or about 5 microns. The skilled artisan will appreciate that the thickness of the seal 842 will depend on various factors, including the estimated lifetime of the device, the material of the seal 842, the amount of contaminants and moisture that are estimated to permeate into the package structure 800 during the lifetime, the humidity of the ambient environment, the allowable product thickness and the particular configuration of desiccant 920 and cover 915 within the package structure 800. Thicker product specifications reduce the requirement of having a thin seal, and also allow more room to include more desiccants inside of the product package. The applied seal 842 can be continuous or not continuous. Where the seal 842 is not continuous, there may be an opening or multiple openings that can be utilized for a combination of processes and later be sealed up. For example, out gassing materials from any of the processing steps, like thermal curing, baking, post releasing and desiccant activation, may be released through the holes. The backplate 820 is then positioned over the substrate 810, and the substrate 810 and the backplate 820 are sealed together by the seal 842 to form the package structure or device 800.

In some embodiments, an outer bead (not shown) of adhesive or seal 842 is applied around the perimeter of the cover 915. The outer bead may include a low permeation rate adhesive, which can provide additional environmental protection to the package structure 800. The outer bead of adhesive may be useful in an environment having a great deal of contaminants where the seal 842 alone cannot serve as an effective hermetic seal. The outer bead could be a combination of hydrophobic materials or adhesives with a hydrophobic layer applied on the outside.

As will be described more completely below, the covered desiccant 840 comprises a desiccant 920 that is deposited within a cover 915. The cover 915 protects the desiccant or desiccant material 920 so that it is not activated too early in the manufacturing process. Desiccant or desiccant material 920 provides a means for desiccating an environment surrounding said interferometrically reflecting means. It is also a means for desiccating the interior of a MEMS system based device or a package structure 800. The cover 915 provides a means for protecting the desiccant 920 or desiccating means. As is known, desiccants 920 may be very sensitive to moisture in the environment. If the desiccant 920 is stored, or exposed, in the ambient environment for too long, the desiccant will begin to absorb moisture from the air and thereby be less effective once it is finally deposited within the MEMS device. Accordingly, there are advantages in keeping the desiccant 920 away from the ambient environment until it is required in order to manufacture the MEMS device. Because MEMS devices, and particularly interferometric modulators, can be manufactured in ambient conditions, desiccants 920 that are protected during such manufacturing may be more desirable. The covered desiccant 840 is one embodiment of a means for providing protected desiccant 920 or desiccating means.

As mentioned above, a desiccant 920 may be used to reduce moisture resident within the package structure 800. Desiccants 920 may be used for packages that have either hermetic or semi-hermetic seals. In a package having a semi-hermetic seal, a desiccant 920 may be used to control moisture moving into the package structure 800 from the environment. The skilled artisan will appreciate that a desiccant 920 may not be necessary for a hermetically sealed package, but may be desirable to control moisture within the package structure 800. For packages having hermetic seals, desiccants 920 may be provided within the package to absorb any moisture that moves into the package during the manufacturing process.

Generally, any substance that can trap moisture while not interfering with the optical properties of the interferometric modulator 830 may be used as the desiccant 920. Suitable desiccant materials 920 include, but are not limited to, CaO, zeolites, molecular sieves, surface adsorbents, bulk adsorbents, chemical reactants, and a mixture thereof. More than one type of desiccant material may be included in a package 800 as a desiccant 920. Patch-like or sheet desiccants may also be used as a desiccant material 920. Examples of sheet desiccants include HG Sheet made by Dynic USA Corp. and DryFlex made by SAES Getters Group. The skilled artisan will appreciate that the desiccant material 920 should be selected based on a variety of factors, including the estimated amount to contaminant gases in the environment as well as the absorption rate and amount of the desiccant material 920.

Embodiments of the cover 915 include a thin metal layer, metal mesh, liquid crystal polymer such as LCP, plastic or pressure sensitive adhesives (PSAs). As is known, PSAs are usually tacky or thermal cured to promote adhesion. They can be used as an effective water barrier or a self-adhesive cover in place of a dispensed or printed adhesive in order to attach the covered desiccant 840 to the backplate 820 and array. The cover 915 can also include silica or a glass or similar material. As described below, the cover 915 can be made of hollow metal, a metal with one side open, a metal that is weakened side on one side, rubber, PIB, or other like material. In order to manufacture the device 800, the covered desiccant 840 can be laid on the substrate 810 by an automated or manual process. Of course, it should be realized that the cover 915 can extend around the entire perimeter of the device or alternatively, leave an opening to be closed later as in an endseal process. In one embodiment, the cover 915 has one side open to expose the desiccant 920 to the inside of the package 800. Additionally, in one embodiment the cover 915 has a weakened side that is opened or cracked at assembly thereby allowing the usage of a fast acting desiccant to be incorporated inside the package structure 800, yet not exposed to ambient conditions until after the assembly process has been completed. Similarly, one embodiment may also provide a cover 915 made by a material that can be cracked under the compression during the assembly process.

In one embodiment, the cover 915 is made of a metal 3 sided can-like structure. And of course, any type of desiccant is within the scope of the present application. In one embodiment, as shown in the FIG. 8, the covered desiccant 840 is in a rectangular shape that frames the interferometric modulator array 830. The covered desiccant 840 may have many different shapes, as shown in FIGS. 9A-D. In addition, some desiccant 920 may also present outside of the cover 920.

Figure 9A:
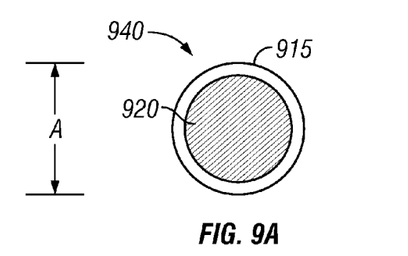
FIGS. 9A-D are cross-sectional views of embodiments of covered desiccants.
Figure 9B:
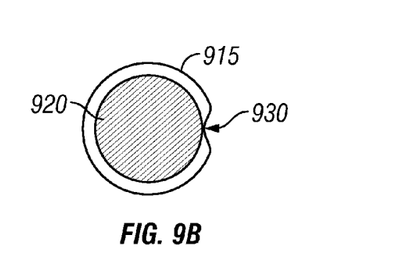

FIG. 9A shows a cross-section of an embodiment of a tubular-shaped covered desiccant 840. The covered desiccant 840 includes a cover 915 and a desiccant 920, wherein the cover 915 at least partially encapsulates the desiccant 920. As can be imagined, the diameter A of the cover 915 can be configured to be slightly larger than the gap distance B (FIG. 8). In one embodiment, the gap distance B is between 50-1000 microns. In another embodiment, the gap distance B is 50-500 microns. And in another embodiment, the gap distance is approximately 100 microns. In yet another embodiment, the gap distance is approximately 50-150 microns. In a larger display device application like signage or a hand held display device application, with little or no constraint on the thickness of the display, the diameter of the sealant is not limited and can exceed 5-10 mm. If the diameter A of the cover 915 is slightly greater than the gap distance between the backplate 820 and substrate 810, the cover 915 will become compressed when the backplate 820 is brought together and sealed to the substrate 810. By choosing the correct material and thickness for the cover 915, one can control the point at which the cover 915 will crack and thereby expose the desiccant material 920 to the interior of the sealed device or package structure 800. Covering the desiccant material 920 with the cover 915 protects it from the ambient environment until it needs to be used to manufacture the device 800.

Of course, it should be realized that embodiments are not limited to the particular configuration of the covered desiccant 840 as shown in FIG. 9A. For example, referring to FIG. 9B, another embodiment of a covered desiccant 840 is illustrated. In the embodiment shown in FIG. 9B, there is a scribed cover 915 surrounding desiccant material 920. The cover 915 includes a weakened or scribed area 930 which runs longitudinally along the length of the cover 915. Preferably, the scribed area 930 faces inward towards the interferometric modulator array when it is disposed on the substrate 810. As can be realized, the weakened area 930 is configured to crack or break once pressure is applied onto the cover 915. The weakened area 930 provides a means for locating the breaking point of the cover 915 to a designated position within the device or package structure 800 during manufacturing. Thus, as the cover 915 is compressed when the substrate 810 and the backplate 820 are brought together, the weakened area 930 cracks thereby exposing the desiccant 920 to the interior of the device or package 800. Accordingly, the desiccant is mechanically activated or exposed. As can be imagined, the area of the cover 915 that faces the ambient environment would remain intact in this embodiment to protect the desiccant from the ambient environment. A skilled artisan would also understand that exposing the desiccant 920 means that the desiccant 920 enclosed in the cover 915 is exposed to the interior of the package 800. In embodiments where the patch-like, pouch or sheet desiccant is used, exposing the desiccant 920 does not require that the desiccant material inside of the patch, pouch or sheet is also exposed.

Figure 9C:
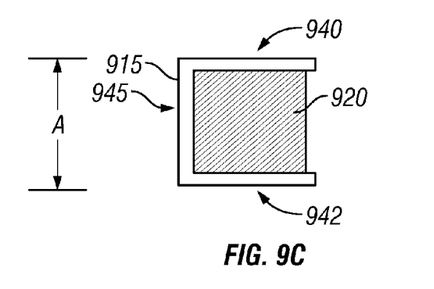

Another embodiment of a covered desiccant 840 is shown in FIG. 9C. In this cross-sectional view, a three-sided cover 915 is illustrated having an interior desiccant material 920. Because one side of the embodiment shown in FIG. 9C is already exposed to the ambient environment, it is not necessary to crack or break the cover 915 when manufacturing a device 800 having this style of covered desiccant. However, in one embodiment, the cover 915 is metallic and the desiccant material 920 is a heat activated desiccant such as a Zeolite which can be heat treated to activate or reactivate its desiccant absorbing properties. Other heat activated desiccants include CaO and Zeolites which are incorporated into a solvent mixture. Upon heat treatment, the solvent is driven off the desiccant leaving the activated moisture absorbing components of the CaO or Zeolite. Accordingly, the desiccant is thermally activated. One examples of a CaO desiccant is the StayDry HiCap 2800 made by Cookson Electronics (Providence, R.I.). One example of a Zeolite type desiccant is DP 4000 made by Cookson Electronics (Providence, R.I.). In other embodiments, hydrophobic materials or materials that are in a Self Aligned Monolayer (SAM) configuration can be incorporated into, mixed with or spread onto the desiccant 920 as necessary for proper operations. Alternatively, it can also be for the surface treatment of the display that is consistent with desiccant and process conditions required for the IMOD operation.

As can be envisioned, the covered desiccant 840 having an cover 915 and a desiccant 920 can be placed around an interferometric modulator array 830, as illustrated in FIG. 8. The open side of the cover 915 would face the interior of the interferometric modulator array 830. A layer of sealant can be applied to the upper surface 940 and lower surface 942 of the cover 915. The backplate 820 and the substrate 810 can thereby be sealed together. The outer surface 945 would face the external environment. Because metal is impervious to water, this configuration provides a metal layer facing the external ambient environment, while the interior of the MEMS device is exposed to the desiccant material 920. Once the backplate 820 is sealed to the substrate 810, the device can be heated to activate any desiccant that can be heat-activated. Because the metal cover 915 would become hot once the device was activated, it would thereafter cause the desiccant 920 to become active or activated. In one embodiment, the seal 842 is not deposited continuously and an opening or openings are present for out gassing during the activation of the desiccant.

Figure 9D:
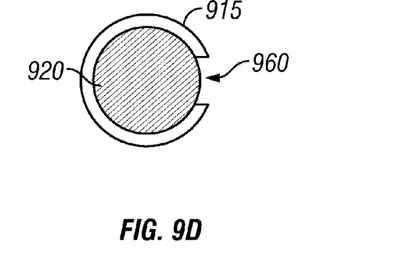

One additional embodiment can be found in FIG. 9D which shows a cross section of a covered desiccant, where there is a tubular cover 915 that covers a desiccant 920. As shown, a longitudinally disposed opening 960 is provided in the cover 915. The gap size of the opening 960 can be selected in order to provide the proper amount and rate of desiccant to the interior of the device 800. For, example, a faster acting desiccant may be encased in a cover 915 that has a relatively small opening 960, whereas a slower acting desiccant may be encased in a cover that has a relatively larger opening 960. Similarly, in some embodiments, the desiccant inside such cover can also be thermally activated. Alternatively, the cover may also have multiple openings or holes along the longitude of the cover 915. The multiple openings or holes may be positioned to face the interferometric modulator array 830.

In some embodiments, additional packs of desiccant, such as sheet or patch-like desiccant described above, may also be included in the package structure 800.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A MEMS based device, comprising:
a substrate having a MEMS device formed on an upper surface of the substrate;
a backplate having an upper surface and a lower surface;
a desiccant disposed between the backplate and the substrate and forming a border that at least partially surrounds said MEMS device; and
a cover at least partially encapsulating said desiccant, wherein said desiccant is activated or exposed to an interior of the device through the cover, and wherein the cover is sealed to the lower surface of the backplate and the upper surface of the substrate.

2. The device of claim 1, wherein said desiccant completely surrounds said MEMS device.

3. The device of claim 1, further comprising a seal surrounding said MEMS device between said substrate and said backplate.

4. The device of claim 3, wherein the seal is disposed on said cover to attach said substrate and said backplate to said cover.

5. The device of claim 3, wherein the seal is disposed along an outer periphery of said desiccant to seal said substrate to said backplate.

6. The device of claim 1, wherein said cover comprises a weakened area running longitudinally along the length of said cover.

7. The device of claim 6, wherein said weakened area faces said MEMS device.

8. The device of claim 1, wherein said cover is formed of a material that cracks when said cover is subjected to a compressive force.

9. The device of claim 1, wherein said cover comprises an opening on one side.

10. The device of claim 1, wherein said cover comprises a metal or a plastic.

11. The device of claim 1, wherein the MEMS device is an interferometric modulator array.

12. The device of claim 1, further comprising:
a processor that is in electrical communication with the array, the processor being configured to process image data; and
a memory device in electrical communication with the processor.

13. The device of claim 12, further comprising a driver circuit configured to send at least one signal to the array.

14. The device of claim 13, further comprising a controller configured to send at least a portion of the image data to the driver circuit.

15. The device of claim 12, further comprising an image source module configured to send the image data to the processor.

16. The device of claim 15, wherein the image source module comprises at least one of a receiver, transceiver, and transmitter.

17. The device of claim 12, further comprising an input device configured to receive input data and to communicate the input data to the processor.

18. A MEMS based device, comprising:
means for transmitting light;
means for interferometrically reflecting light through said transmitting means formed on an upper surface of said transmitting means;
means for encapsulating said interferometrically reflecting means having an upper surface and a lower surface;
means for desiccating an environment surrounding said interferometrically reflecting means and forming a border that at least partially surrounds said interferometrically reflecting means, wherein said desiccating means is exposed or activated; and
means for protecting said desiccating means, said protecting means sealed to the lower surface of the encapsulating means and the upper surface of the transmitting means, and configured to expose the desiccating means to the interior of the device through the protecting means.

19. The device of claim 18, wherein the transmitting means comprises a substrate.

20. The device of claim 18, wherein the interferometrically reflecting means comprises an interferometric modulator array.

21. The device of claim 18, wherein the encapsulating means comprises a backplate.

22. The device of claim 18, wherein the protecting means comprises a cover.

23. The device of claim 18, wherein the desiccating means comprises a desiccant.

24. The device of claim 18, further comprising a seal surrounding said interferometrically reflecting means between said encapsulating means and said transmitting means.

* * * * *